(12) United States Patent
Liu

(10) Patent No.: US 11,662,639 B2
(45) Date of Patent: May 30, 2023

(54) DISPLAY PANEL AND DISPLAY DEVICE

(71) Applicant: TCL CHINA STAR OPTOELECTRONICS TECHNOLOGY CO., LTD., Guangdong (CN)

(72) Inventor: Yi Liu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 42 days.

(21) Appl. No.: 17/605,251

(22) PCT Filed: Sep. 3, 2021

(86) PCT No.: PCT/CN2021/116421
§ 371 (c)(1),
(2) Date: Oct. 21, 2021

(65) Prior Publication Data
US 2023/0074211 A1  Mar. 9, 2023

(30) Foreign Application Priority Data

Aug. 25, 2021 (CN) .................. 202110980101.X

(51) Int. Cl.
*G02F 1/1343* (2006.01)
*G02F 1/1362* (2006.01)
*H01L 27/12* (2006.01)
*G02F 1/13357* (2006.01)

(52) U.S. Cl.
CPC .... *G02F 1/136286* (2013.01); *G02F 1/13439* (2013.01); *G02F 1/134309* (2013.01); *H01L 27/124* (2013.01); *G02F 1/133615* (2013.01); *G02F 2201/121* (2013.01); *G02F 2201/123* (2013.01)

(58) Field of Classification Search
CPC ......... G02F 1/134309; G02F 1/133615; G02F 2201/121; H01L 27/124
See application file for complete search history.

(56) References Cited

U.S. PATENT DOCUMENTS

2015/0109567 A1\* 4/2015 Tago ................. G02F 1/134336
  349/138
2022/0113574 A1\* 4/2022 Zhang ............... G02F 1/136286

\* cited by examiner

*Primary Examiner* — James A Dudek
(74) *Attorney, Agent, or Firm* — Mark M. Friedman

(57) ABSTRACT

The present disclosure discloses a display panel and a display device. A part of the display panel corresponding to each pixel unit includes a pixel electrode layer, a first metal layer, a second metal layer, and a common electrode layer. The second metal layer includes a first data line and a second data line. The common electrode layer includes a common electrode, a main slot disposed on the common electrode, and a first slot and a second slot respectively located at different longitudinal positions. The first slot overlaps the first data line relative to the pixel electrode layer, and the second slot overlaps the second data line relative to the pixel electrode layer.

20 Claims, 8 Drawing Sheets

DISPLAY PANEL AND DISPLAY DEVICE

FIELD OF INVENTION

The present disclosure relates to display technologies, and more particularly, to a display panel and a display device.

BACKGROUND OF INVENTION

Generally, in a pixel structure of a display panel, scanning lines and data lines interlace to define pixel units. For a pixel design with an ultra-high-definition panel or at a high refresh rate, a structure in which data lines are doubled in a single pixel unit can double the pixel charging, thereby improving the charging rate of a pixel. However, for the above pixel unit structure, because the data lines are doubled, the data lines may squeeze a layout space of the pixel, resulting in a reduction in the aperture ratio of the pixel. Using a pixel structure with a relatively small aperture loss as an example, for each pixel, two data lines pass under a pixel opening region and are located on the left and right sides of a pixel opening. Because positive and negative polarities of the two data lines are different, a coupling effect on a pixel electrode can be positively and negatively offset. A current pixel structure has a horizontal main pixel electrode and a longitudinal main pixel electrode in a cross configuration, and potentials of the pixel electrodes are controlled by data lines. However, from optical features of the current pixel structure formed by using two data lines, it is found that when a pixel is in a bright state, a cross-shaped dark fringe is formed in a main region of a pixel electrode. That is, the cross-shaped dark fringe and the two data lines in the opening region respectively occupy different regions of the pixel opening region, and together cause a pixel transmittance loss and reduce an area of the pixel opening.

SUMMARY OF INVENTION

The present disclosure provides a display panel and a display device to resolve the technical problem of a conventional display panel that double data lines and a cross-shaped dark fringe occupy different regions of a pixel opening, which causes a pixel penetration loss and reduces an area of the pixel opening.

To resolve the foregoing problem, technical solutions provided in the present disclosure are as follows.

Embodiments of the present disclosure provide a display panel, including a first substrate and a second substrate that are disposed opposite to each other, a display layer, and a plurality of pixel units distributed between the first substrate and the second substrate. A part of the display panel corresponding to each of the pixel units includes a pixel electrode layer disposed between the first substrate and the display layer, and including a pixel electrode, an isolation groove, and a shielding electrode, wherein the isolation groove is disposed between the pixel electrode and the shielding electrode and surrounds the pixel electrode; a first metal layer, disposed on the first substrate and located between the pixel electrode layer and the first substrate; a second metal layer, disposed between the first substrate and the pixel electrode layer and including a data line group having a first data line and a second data line, wherein the data line group is electrically connected to the pixel electrode layer; and a common electrode layer, disposed between the second substrate and the display layer and including a common electrode, a main slot, a first slot, and a second slot that are disposed in the common electrode, wherein the common electrode is disposed corresponding to the pixel electrode, and the first slot and the second slot are respectively located at different longitudinal positions, wherein the first slot is perpendicular to and connected to a side of the main slot, the second slot is perpendicular to and connected to another side of the main slot, the first slot overlaps the first data line relative to the pixel electrode layer, and the second slot overlaps the second data line relative to the pixel electrode layer.

Further, the main slot includes a first end and a second end that are disposed opposite to each other, and an intermediate axis defined between the first end and the second end, wherein the first slot and the second slot are respectively located on two opposite sides of the intermediate axis, a horizontal distance between the first data line and the intermediate axis is less than a horizontal distance between the first data line and the first end, and a horizontal distance between the second data line and the intermediate axis is less than a horizontal distance between the second data line and the second end.

Further, an orthographic projection of the main slot on the pixel electrode layer is located at a central position of the pixel electrode or near the central position, and the first end and the second end of the main slot respectively extend to two opposite sides of the pixel electrode, or extend beyond the two opposite sides of the pixel electrode.

Further, the first data line and the second data line respectively include top line segments, bottom line segments, and vertical line segments located between the top line segments and the bottom line segments, wherein the top line segment and the bottom line segment are respectively inclined toward the intermediate axis of the main slot, the vertical line segment of the first data line corresponds to a position of the first slot, and the vertical line segment of the second data line corresponds to a position of the second slot.

Further, the pixel electrode of the pixel electrode layer is a rectangular electrode block, and the shielding electrode is disposed to surround the isolation groove and is electrically connected to the second metal layer.

Further, an orthographic projection of an end of the first slot away from the main slot on the pixel electrode layer is beyond a top side of the pixel electrode, and an orthographic projection of an end of the second slot away from the main slot on the pixel electrode layer is beyond a bottom side of the pixel electrode.

Further, the main slot has a first width, the first slot and the second slot respectively have second widths, and the first width and the second width are less than or equal to 30 microns and greater than or equal to 3 microns.

Further, the main slot is horizontal and is disposed in the common electrode in a horizontal direction, the first slot and the second slot are respectively vertical and perpendicular to the main slot, a width of the first data line is greater than or equal to a width of the first slot or a width of the second slot, and a width of the second data line is greater than or equal to the second slot or the width of the second slot.

Further, the display panel further includes a gate insulating layer, a buffer layer disposed on the second metal layer, a color film layer and a planar layer that are disposed between the buffer layer and the second substrate.

The embodiments of the present disclosure further provide a display device, including a backlight module and the display panel as described above, and the backlight module is configured to provide a light source required by the display panel.

In a display panel and a display device provided by the present disclosure, a common electrode layer includes a main slot, a slot structure including a first slot and a second slot that are disposed on opposite sides of the main slot at intervals, and a pixel electrode layer includes a pixel electrode structure including a rectangular block-shaped pixel electrode, an isolation groove, and a shielding electrode. A first data line and a second data line are disposed extending inward in combination with the slot structure and the pixel electrode structure, so that the first slot and the second slot present a non-cross-shaped dark region, and the dark region may be shielded by the first data line and the second data line, and does not occupy different parts of a pixel opening, thereby reducing a loss of the pixel opening, improving the charging rate of a pixel, and enhancing the display effect of the display panel with a high refresh rate. Correspondingly, the display panel and the display device of the present disclosure effectively resolve the problem of a pixel transmittance loss and an area reduction of a pixel opening of a conventional display panel that are caused by that a cross-shaped dark fringe and data lines in an opening region respectively occupy different regions of the pixel opening.

BRIEF DESCRIPTION OF DRAWINGS

To describe the technical solutions in the embodiments of the present disclosure or the related art more clearly, the following briefly describes the accompanying drawings required for describing the embodiments or the related art. Apparently, the accompanying drawings in the following description show merely some embodiments of the present disclosure, and a person of ordinary skill in the art may still derive other drawings from the accompanying drawings without creative efforts.

DETAILED DESCRIPTION OF PREFERRED EMBODIMENTS

Figure 1:
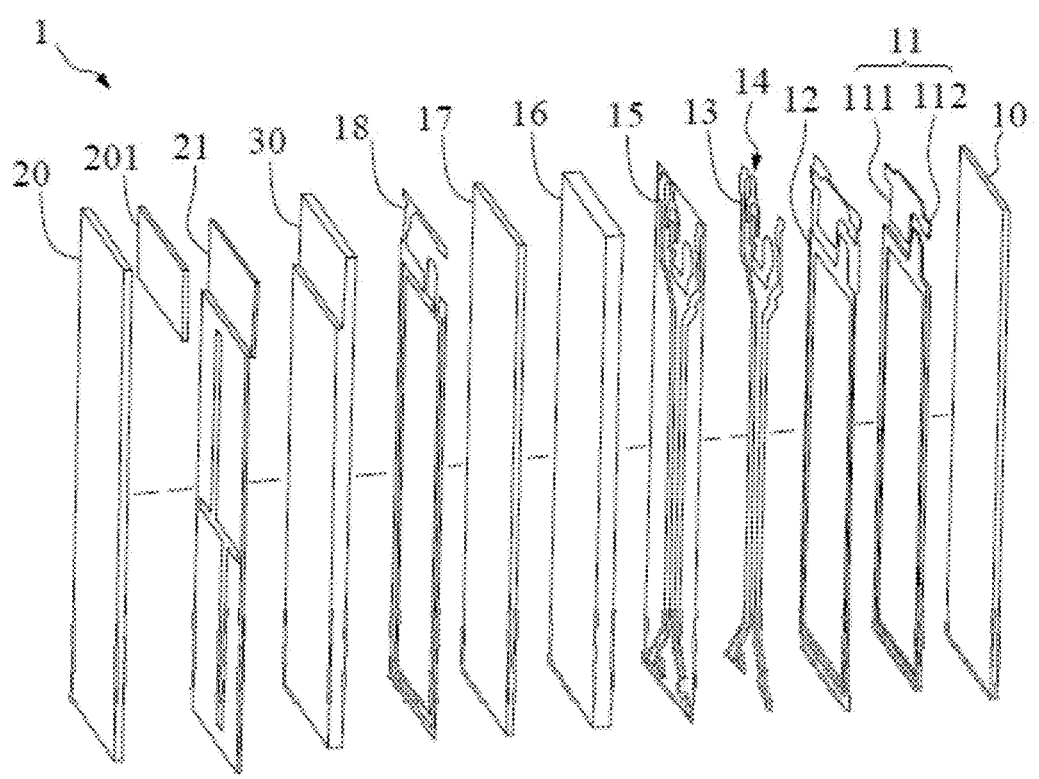
FIG. 1 is a three-dimensional schematic exploded diagram of a structure of a display panel according to an embodiment of the present disclosure.

The following embodiments are described with reference to the accompanying drawings, and are used to exemplify particular embodiments that the present disclosure can be used to implement. Direction terms mentioned in the present disclosure such as "upper", "lower", "front", "rear", "left", "right", "inner", "outer", and "side" are only directions with reference to the accompanying drawings. Therefore, the used direction terms are intended to describe and understand this application, but are not intended to limit this application. In the drawings, units whose structures are the same are indicated using the same reference numbers. In the accompanying drawings, for clear understanding and ease description, the thickness of some layers and regions are exaggerated. That is, the size and thickness of each component shown in the accompanying drawings are arbitrarily shown, but this application is not limited thereto.

Embodiments of the present disclosure provide a display panel, and in particular, a liquid crystal display panel with a thin film transistor array. The display panel is provided with a plurality of gate scanning lines and a plurality of data lines. The plurality of gate scanning lines and the plurality of data lines define a plurality of pixel units, and each pixel unit is provided with a thin film transistor and a pixel electrode. Specifically, in an embodiment of the present disclosure, a display unit is driven by using a structure in which a quantity of gate lines in a single pixel unit is halved and a quantity of data lines is doubled. That is, each pixel unit drives the pixel unit by using a combination of two data lines and one scanning line.

FIG. 1 is a three-dimensional schematic exploded diagram of a structure of a display panel 1 according to an embodiment of the present disclosure. As shown in FIG. 1, the display panel 1 in the present embodiment of the present disclosure has a stacking structure, including a first substrate 10, a first metal layer 11, a gate insulating layer 12, a second metal layer 13, a passivation layer 15, a color film layer 16, a planar layer 17, a pixel electrode layer 18, a display layer 30, a common electrode layer 21, a black matrix layer 201, and a second substrate 20 that are disposed from bottom to top (that is, from right to left as shown in FIG. 1). It is particularly noted that the display panel 1 of the present disclosure is described by using a pixel design that a pixel unit has four domains in FIG. 1 as an example, wherein the first substrate 10 and the second substrate 20 may be glass substrates, quartz substrates, or plastic substrates, which are not limited herein. A plurality of pixel units are arranged between the first substrate 10 and the second substrate 20 in an array manner. The display layer 30 in the present embodiment is a liquid crystal display layer including a plurality of liquid crystal molecules (not shown in the figure). In addition, the first metal layer 11 includes a gate 111 and a scanning line 112, and the second metal layer 13 includes a data line group 130 and an active component 14, wherein the data line group 130 comprising a first data line 131 and a second data line 132, and the active component 14 and the gate 111 together form a thin film transistor. That is, the first substrate 10 of the present disclosure is an array substrate. That is, the display panel 1 of the present disclosure is a thin film transistor liquid crystal display panel.

As shown in FIG. 1, materials of the gate insulating layer 12, the passivation layer 15 and the planar layer 17 may respectively be nitride (silicon nitride, or the like), oxide (silicon oxide, silicon dioxide, or the like), or other insulating materials. In addition, the color film layer 16 in the present embodiment of the present disclosure is integrated with the first substrate 10 to form a color filter on array (COA) structure. By means of the COA structure, it may prevent a deviation during aligning of the first substrate 10 and the second substrate 20 from affecting the aperture ratio of a display device, and a problem of light leakage. However, the display panel 1 of the present disclosure is not limited to the COA structure. That is, the color film layer 16 may alternatively be disposed on a side of the second substrate 20 (not shown in the figure), thereby forming a color filter substrate with a non-COA structure.

Figure 2:
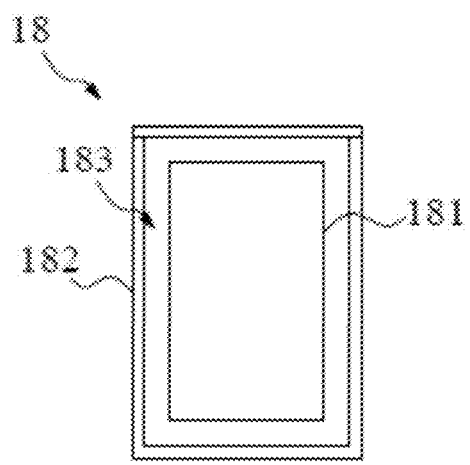
FIG. 2 is a schematic diagram of a partial structure of a pixel electrode layer according to an embodiment of the present disclosure.

FIG. 2 is a schematic diagram of a partial structure of the pixel electrode layer 18 according to an embodiment of the present disclosure. As shown in FIG. 2, a material of the pixel electrode layer 18 I the present embodiment of the present disclosure is indium tin oxide (ITO), and includes a pixel electrode structure including a pixel electrode 181, a shielding electrode 182, and an isolation groove 183. The isolation groove 183 is disposed between the pixel electrode 181 and the shielding electrode 182 and surrounds the pixel electrode 181. A width of the isolation groove 183 is greater than or equal to 2 microns. It is particularly noted that, different from a conventional pixel unit structure, the pixel electrode 181 of the present disclosure is a whole rectangular electrode block. That is, there is no slit in the rectangular electrode block.

Figure 3:
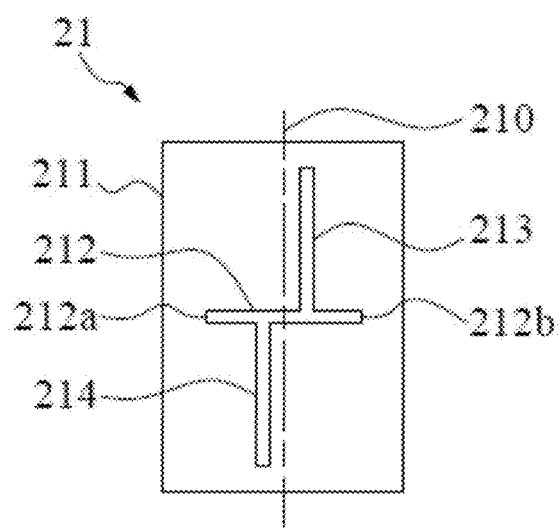
FIG. 3 is a schematic diagram of a partial structure of a common electrode layer according to an embodiment of the present disclosure.

Referring to FIG. 3 in combination with FIG. 1, FIG. 3 is a schematic diagram of a partial structure of the common electrode layer 21 according to an embodiment of the present disclosure. The common electrode layer 21 is disposed between the second substrate 20 and the display layer 30 (as shown in FIG. 1). As shown in FIG. 3, a material of the common electrode layer 21 is ITO, and includes a common electrode 211 and a slot structure that is formed in the common electrode 211 and penetrates the common electrode 211. The slot structure includes a main slot 212, a first slot 213, and a second slot 214. The common electrode 211 is disposed corresponding to the rectangular block-shaped pixel electrode 181. In the present embodiment, the first slot 213 and the second slot 214 are located at different longitudinal positions. The first slot 213 is perpendicular to and connected to a side of the main slot 212, and the second slot 214 is perpendicular to and connected to another side of the main slot 212. Specifically, the main slot 212 includes a first end 212a and a second end 212b that are disposed opposite to each other, and an intermediate axis 210 defined between the first end 212a and the second end 212b. The first slot 213 and the second slot 214 are respectively located on two opposite sides of the intermediate axis 210. In the present embodiment, the main slot 212 has a first width D1, and the first slot 213 and the second slot 214 respectively have second widths D2. The first width D1 and the second width D2 are respectively less than or equal to 30 microns, and are greater than or equal to 3 microns. It is particularly noted that the first width D1 cannot be too small, otherwise a deflection electric field induced by an ITO gap may not be very strong, and a dark fringe corresponding to the slot structure may not be formed as expected. In addition, considering a loss of pixel transmittance, the first width D1 and the second width D2 cannot be too large. In other words, a greater slot width indicates a greater loss of the aperture ratio, that is, a smaller effective light-emitting area of a pixel. Therefore, a range is preferably less than or equal to 30 microns in a case of implementing required functions.

In addition, as shown in FIG. 3, the first slot 213 and the main slot 212 together form an approximately inverted-T configuration, and the second slot 214 and the main slot 212 together form a T configuration. Specifically, the first slot 213, the second slot 214, and the main slot 212 together form an approximately zigzag configuration in a lateral viewing angle.

Figure 4:
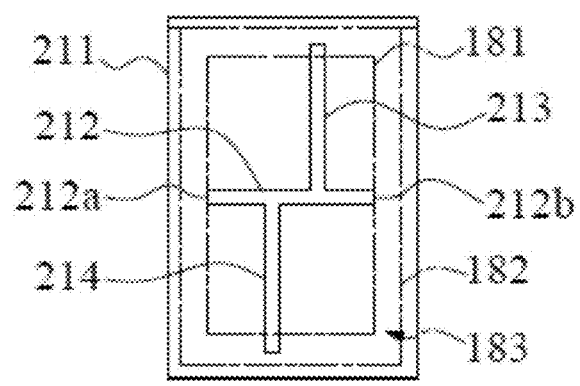
FIG. 4 is a schematic diagram of a structure in which the pixel electrode layer and the common electrode layer are aligned with each other.
Figure 5:
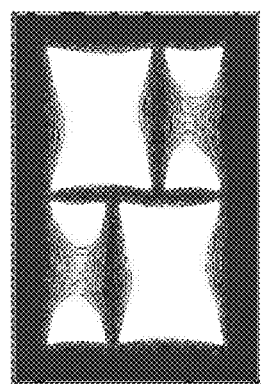
FIG. 5 is a schematic diagram of optical simulation of a pixel unit according to an embodiment of the present disclosure.

Refer to FIG. 4 and FIG. 5. FIG. 4 is a schematic diagram of a structure in which the pixel electrode layer 18 and the common electrode layer 21 are aligned with each other. FIG. 5 is a schematic diagram of optical simulation of a pixel unit according to an embodiment of the present disclosure. As shown in FIG. 4, in the common electrode layer 21 in a viewing angle of an orthographic projection of the pixel electrode layer 18, an end of the first slot 213 away from the main slot 212 extends beyond a top side of the pixel electrode 181 and enters the isolation groove 183 of the pixel electrode layer 18. An end of the second slot 214 away from the main slot 212 extends beyond a bottom side of the pixel electrode 181 and enters the isolation groove 183. In addition, as shown in FIG. 4, the main slot 212 is located at or near a center position of the corresponding pixel electrode 181, and the first end 212a and the second end 212b of the main slot 212 respectively extend to two opposite sides of the pixel electrode 181, or extend beyond the two opposite sides of the pixel electrode 181. As shown in FIG. 5, by means of the slot structure including the main slot 212, the first slot 213, the second slot 214 in the common electrode layer 21 and the rectangular block-shaped pixel electrode 181 and the isolation groove 183 below, an optical simulation image perfectly shows dark fringe shapes of the main slot 212, the first slot 213, and the second slot 214 of the pixel unit of the present disclosure under data signal control of the data line group 130. That is, there is no abnormal dark fringe. In addition, a slit electric field formed by the rectangular isolation groove 183 is configured to induce a liquid crystal in the pixel unit to tilt correctly. It is particularly noted that a length first slot that the first slot 213 exceeds the pixel electrode 181 needs to be greater than or equal to 1 micron, and a length second slot that the second slot 214 exceeds the pixel electrode 181 needs to be greater than or equal to 1 micron. Only through the above structure can a display state of the present disclosure be free of an abnormal dark fringe as shown in FIG. 5.

Figure 6:
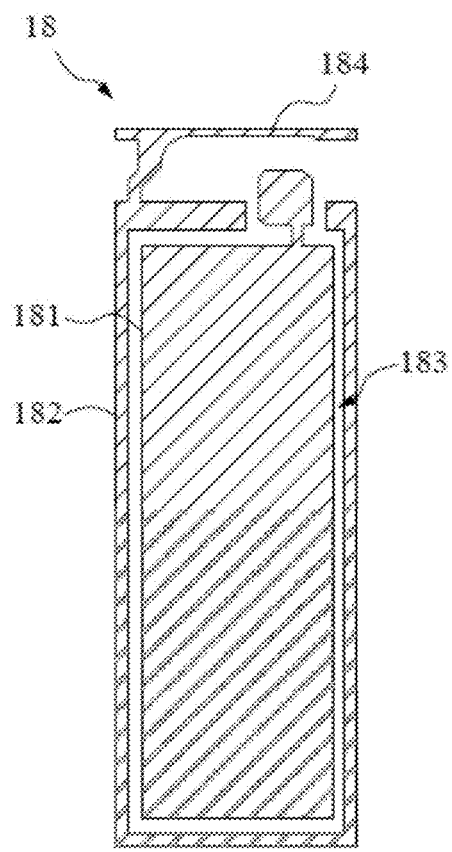
FIG. 6 is a schematic diagram of a structure of a pixel electrode layer according to an embodiment of the present disclosure.

As mentioned above, a half gate and two data (HG2D) structure is used in the pixel unit of the present disclosure to improve the charging rate of a pixel, thereby enhancing the display effect with a high refresh rate. As shown in FIG. 1, the first data line 131 and the second data line 132 of an embodiment of the present disclosure jointly form the data line group 130, which is disposed under the pixel electrode layer 18. FIG. 6 is a schematic diagram of a structure of the pixel electrode layer 18 according to an embodiment of the present disclosure. As shown in FIG. 6, the shielding electrode 182 is disposed to surround the isolation groove 183, and a connecting wire 184 extends from a side of the shielding electrode 182 to be electrically connected to the second metal layer 13. In the present embodiment of the present disclosure, the shielding electrode 182 forms a common electrode line with a data line black matrix less (DBS) structure, but this is not limited thereto.

Figure 7:
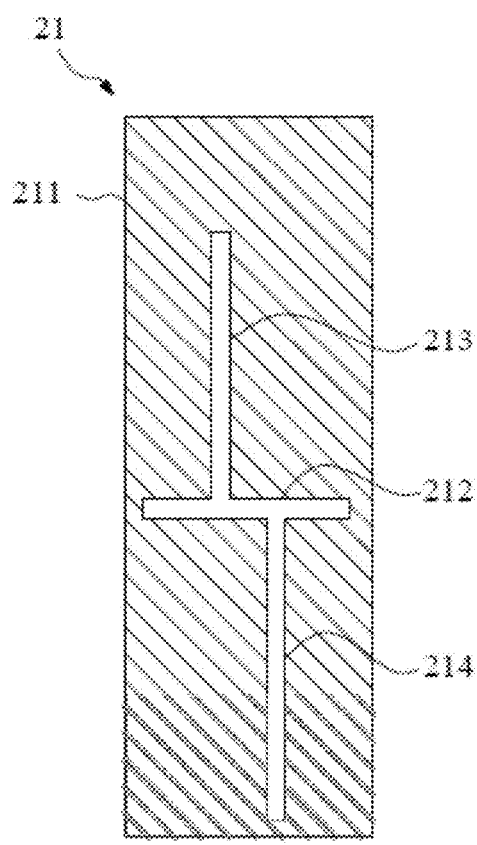
FIG. 7 is a schematic diagram of a structure of a common electrode layer according to an embodiment of the present disclosure.

FIG. 7 is a schematic diagram of a structure of a common electrode layer 21 according to an embodiment of the present disclosure. The common electrode layer 21 shown in FIG. 7 is a reverse view of the common electrode layer 21 shown in FIG. 3. As shown in FIG. 7, the common electrode layer 21 includes a common electrode 211 and a slot structure that is formed in the common electrode 211 and penetrates the common electrode 211. The slot structure includes a main slot 212, a first slot 213, and a second slot 214. A mutual structural relationship has been described in detail above, and is not repeated herein. It is particularly noted that a black matrix layer 201 may be disposed between the top of the common electrode layer 21 and the second substrate 20 to shield an element below.

Figure 8:
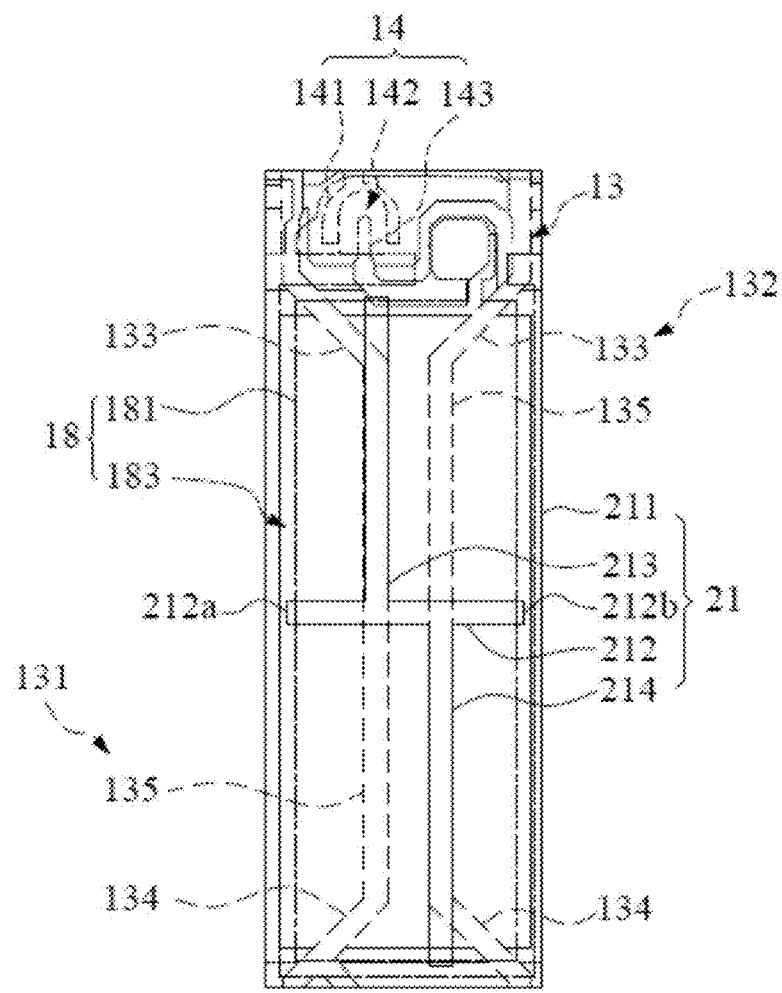
FIG. 8 is a schematic diagram of a partial planar combined structure of the display panel in FIG. 1.

Refer to FIG. 8 in combination with FIG. 1, and FIG. 3. FIG. 8 is a schematic diagram of a partial planar combined structure of the display panel in FIG. 1, and is mainly used to indicate correspondences among the common electrode layer 21, the pixel electrode layer 18, and the second metal layer 13. As shown in FIG. 8, the active component 14 of the second metal layer 13 includes a source 141, a drain 142, and a channel layer 143. The active component 14 is correspondingly located in a region between a connecting line 184 of the shielding electrode 182 and the pixel electrode 181 Referring to FIG. 8 and FIG. 3, a horizontal distance between the first data line 131 and the intermediate axis 210 of the main slot 212 is less than a horizontal distance between the first data line 131 and the first end 212a of the main slot 212, and a horizontal distance between the second data line 132 and the intermediate axis 210 is less than a horizontal distance between the second data line 132 and the second end 212b. Specifically, as shown in FIG. 8, the first data line 131 and the second data line 132 respectively include top line segments 133, bottom line segments 134, and vertical line segments 135 respectively located between the top line segments 133 and the bottom line segments 134. The top line segment 133 and the bottom line segment 134 are respectively inclined toward the intermediate axis 210, so that the vertical line segment 135 approaches the intermediate axis 210. In this way, the vertical line segment 135 of the first data line 131 corresponds to a position of the first slot 213, and the vertical line segment 135 of the second data line 132 corresponds to a position of the second slot 214. That is, the first slot 213 overlaps the first data line 131 relative to the pixel electrode layer 18, and the second slot 214 overlaps the second data line 132 relative to the pixel electrode layer 18. It is particularly noted that a width of the first data line 131 and a width of the second data line 132 are respectively greater than or equal to a width of the first slot 213 or the second slot 214, so that the first data line 131 and the second data line 132 can respectively cover the first slot 213 and the second slot 214.

As described above, in the pixel unit of the display panel 1 of the present disclosure, the first data line 131 and the second data line 132 respectively extend toward a middle part of the common electrode layer 21, and are disposed in combination with the first slot 213 and the second slot 214. In this way, dark regions presented by the first slot 213 and the second slot 214 can be shielded by the first data line 131 and the second data line 132, so that different parts of a pixel opening are not occupied, and a loss of the pixel opening is reduced.

Figure 9:
FIG. 9 is a simulation diagram of pixel dark fringe distribution of a pixel unit according to an embodiment of the present disclosure.

FIG. 9 is a simulation diagram of pixel dark fringe distribution of a pixel unit according to an embodiment of the present disclosure. As shown in FIG. 9, in a state of a voltage of 7 volts, a voltage difference of the liquid crystal dark fringe between an ITO electrode of a second substrate 20 (that is, an upper plate) and an ITO electrode of a first substrate 10 (that is, a lower plate) is stable, and the liquid crystal dark fringe is uniformly distributed. A first data line 131 and a second data line 132 respectively overlap a dark fringe of a first slot 213 on the left and a dark fringe of a second slot 214 on the right, which reduces a loss of a pixel opening.

Figure 10:
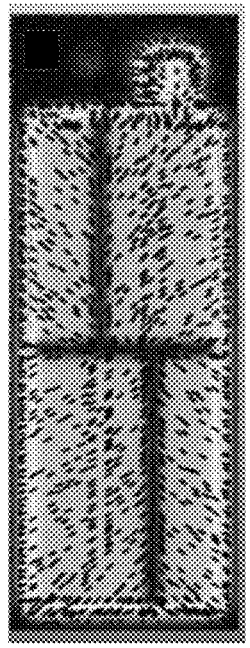
FIG. 10 is a distribution diagram of an electric potential field of a pixel and liquid crystal backward directions of a pixel unit according to an embodiment of the present disclosure.

FIG. 10 is a distribution diagram of an electric potential field and liquid crystal backward directions of the pixel unit in FIG. 9. As shown in FIG. 10, a pixel electrode structure including a rectangular block-shaped pixel electrode 181, a shielding electrode 182, and an isolation groove 183 is used in combination with a slot structure including the first slot 213 and the second slot 214 of a main slot 212, so that electric potentials in the first slot 213 and the second slot 214 are the highest under data signal control of the data lines, and the liquid crystal backward directions distributed on the pixel unit are respectively distributed in directions of 45°, 135°, −45°, and −135° in four domains, which can achieve the same liquid crystal orientation achieved by a slit design of a conventional pixel electrode.

Figure 11:
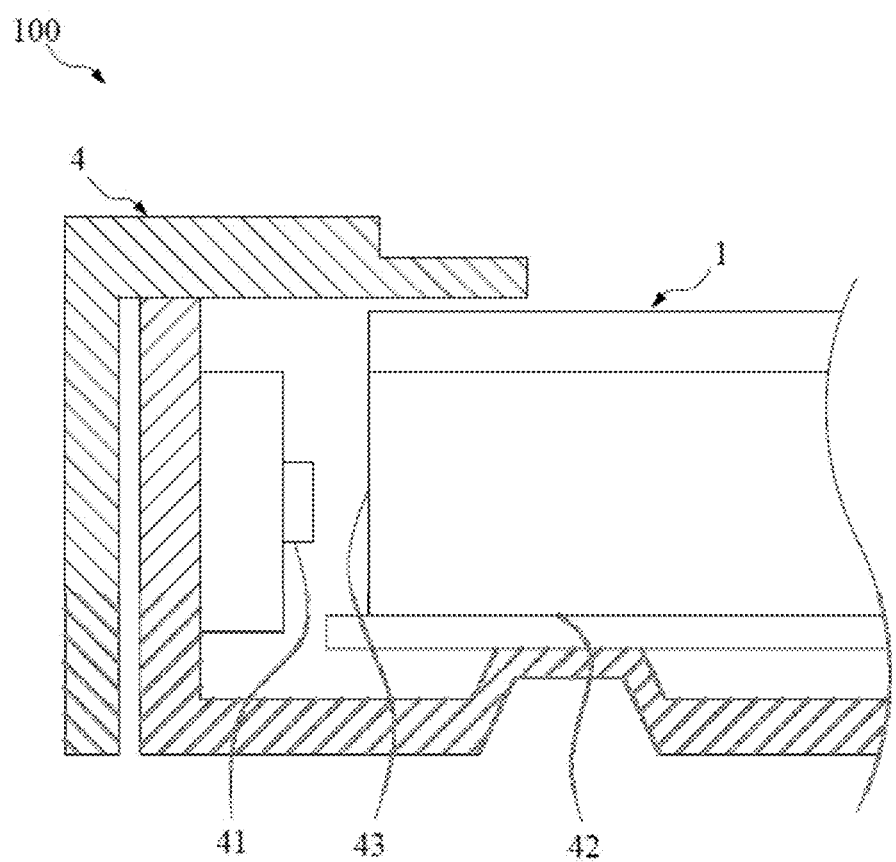
FIG. 11 is a schematic diagram of a structure of a display device according to an embodiment of the present disclosure.

FIG. 11 is a schematic diagram of a structure of a display device 100 according to an embodiment of the present disclosure. As shown in FIG. 11, the embodiments of the present disclosure further provide the display device 100, which includes a backlight module 4 and the display panel 1 in the above embodiment. The backlight module 4 in the present embodiment of the present disclosure is configured to, by using an edge-type backlight as an example, provide a light source required by the display panel 1. The backlight module 4 includes optical elements such as a light-emitting element 41, a reflector plate 42, and a diffuser plate 43. A detailed structure of the backlight module 4 may be the same as a structure of a backlight module of a conventional liquid crystal display device, and details are not repeated herein.

In summary, in a display panel and a display device provided by the present disclosure, a common electrode layer includes a main slot, a slot structure including a first slot and a second slot that are disposed on opposite sides of the main slot at intervals, and a pixel electrode layer includes a pixel electrode structure including a rectangular block-shaped pixel electrode, an isolation groove, and a shielding electrode. A first data line and a second data line are disposed extending inward in combination with the slot structure and the pixel electrode structure, so that the first slot and the second slot present a non-cross-shaped dark region, and the dark region may be shielded by the first data line and the second data line, and does not occupy different parts of a pixel opening, thereby reducing a loss of the pixel opening, improving the charging rate of a pixel, and enhancing the display effect of the display panel with a high refresh rate. Correspondingly, the display panel and the display device according to the embodiments of the present disclosure effectively resolve the problem of a pixel transmittance loss and an area reduction of a pixel opening of a conventional display panel that are caused by that a cross-shaped dark fringe and data lines in an opening region respectively occupy different regions of the pixel opening.

In the foregoing embodiments, description of each embodiment focuses on a different part, and for parts that are not described in detail in one embodiment, reference may be made to the related description of other embodiments.

The embodiments of the present disclosure are described in detail above, and specific examples are used in the specification to illustrate the principles and implementations of the present disclosure. The descriptions of the above embodiments are only used to help understand the technical solutions and core ideas of the present disclosure. A person of ordinary skill in the art should understand that modifications can still be made to the technical solutions recorded in the foregoing embodiments, or equivalent replacements can be made to some technical features in the technical solutions, and such modifications or replacements do not cause the essence of corresponding technical solutions to depart from the scope of the technical solutions of the embodiments of the present disclosure.

What is claimed is:

1. A display panel, comprising a first substrate and a second substrate disposed opposite to each other, a display layer, and a plurality of pixel units distributed between the first substrate and the second substrate, wherein a part of the display panel corresponding to each of the pixel units comprises:
   a pixel electrode layer disposed between the first substrate and the display layer and comprising a pixel electrode, an isolation groove, and a shielding electrode, wherein the isolation groove is disposed between the pixel electrode and the shielding electrode and surrounds the pixel electrode;
   a first metal layer disposed on the first substrate and located between the pixel electrode layer and the first substrate;
   a second metal layer disposed between the first substrate and the pixel electrode layer and comprising a data line group having a first data line and a second data line, wherein the data line group is electrically connected to the pixel electrode layer; and
   a common electrode layer disposed between the second substrate and the display layer and comprising a common electrode, and a main slot, a first slot, and a second slot disposed in the common electrode, wherein the common electrode is disposed corresponding to the pixel electrode, the first slot and the second slot are respectively located at different longitudinal positions, the first slot is connected to a side of the main slot, the second slot is connected to another side of the main slot, the first slot overlaps the first data line relative to the pixel electrode layer, and the second slot overlaps the second data line relative to the pixel electrode layer.

2. The display panel as claimed in claim 1, wherein the main slot comprises a first end and a second end disposed opposite to each other, and an intermediate axis defined between the first end and the second end, the first slot and the second slot are respectively located on two opposite sides of the intermediate axis, a horizontal distance between the first data line and the intermediate axis is less than a horizontal distance between the first data line and the first end, and a horizontal distance between the second data line and the intermediate axis is less than a horizontal distance between the second data line and the second end.

3. The display panel as claimed in claim 2, wherein an orthographic projection of the main slot on the pixel electrode layer is located at a central position of the pixel electrode or near the central position, and the first end and the second end of the main slot respectively extend to two opposite sides of the pixel electrode, or extend beyond the two opposite sides of the pixel electrode.

4. The display panel as claimed in claim 2, wherein the first data line and the second data line respectively comprise top line segments, bottom line segments, and vertical line segments located between the top line segments and the bottom line segments, wherein the top line segment and the bottom line segment are respectively inclined toward the intermediate axis of the main slot, the vertical line segment of the first data line corresponds to a position of the first slot, and the vertical line segment of the second data line corresponds to a position of the second slot.

5. The display panel as claimed in claim 1, wherein the pixel electrode of the pixel electrode layer is a rectangular electrode block, and the shielding electrode is disposed to surround the isolation groove and is electrically connected to the second metal layer.

6. The display panel as claimed in claim 5, wherein an orthographic projection of an end of the first slot away from the main slot projected on the pixel electrode layer is beyond a top side of the pixel electrode, and an orthographic projection of an end of the second slot away from the main slot projected on the pixel electrode layer is beyond a bottom side of the pixel electrode.

7. The display panel as claimed in claim 1, wherein the main slot has a first width, the first slot and the second slot respectively have second widths, and the first width and the second width are less than or equal to 30 microns and greater than or equal to 3 microns.

8. The display panel as claimed in claim 1, wherein the main slot is horizontal and is disposed in the common electrode in a horizontal direction, the first slot and the second slot are respectively vertical and perpendicular to the main slot, a width of the first data line is greater than or equal to a width of the first slot or a width of the second slot, and a width of the second data line is greater than or equal to the second slot or the width of the second slot.

9. The display panel as claimed in claim 1, wherein the display panel further comprises a gate insulating layer, a passivation layer disposed on the second metal layer, and a color film layer and a planar layer disposed between the passivation layer and the second substrate.

10. A display device, comprising a backlight module and a display panel, wherein the backlight module is configured to provide a light source required by the display panel, the display panel comprises a first substrate and a second substrate disposed opposite to each other, a display layer, and a plurality of pixel units distributed between the first substrate and the second substrate, and wherein a part of the display panel corresponding to each of the pixel units comprises:
   a pixel electrode layer disposed between the first substrate and the display layer and comprising a pixel electrode, an isolation groove, and a shielding electrode, wherein the isolation groove is disposed between the pixel electrode and the shielding electrode and surrounds the pixel electrode;
   a first metal layer disposed on the first substrate and located between the pixel electrode layer and the first substrate;
   a second metal layer disposed between the first substrate and the pixel electrode layer and comprising a data line group having a first data line and a second data line, wherein the data line group is electrically connected to the pixel electrode layer; and
   a common electrode layer disposed between the second substrate and the display layer and comprising a common electrode, and a main slot, a first slot, and a second slot disposed in the common electrode, wherein the common electrode is disposed corresponding to the pixel electrode, the first slot and the second slot are respectively located at different longitudinal positions, the first slot is connected to a side of the main slot, the second slot is connected to another side of the main slot, the first slot overlaps the first data line relative to the pixel electrode layer, and the second slot overlaps the second data line relative to the pixel electrode layer.

11. The display device as claimed in claim 10, wherein the main slot comprises a first end and a second end disposed opposite to each other, and an intermediate axis defined between the first end and the second end, the first slot and the second slot are respectively located on two opposite sides of the intermediate axis, a horizontal distance between the first data line and the intermediate axis is less than a horizontal distance between the first data line and the first end, and a horizontal distance between the second data line and the intermediate axis is less than a horizontal distance between the second data line and the second end.

12. The display device as claimed in claim 11, wherein an orthographic projection of the main slot on the pixel electrode layer is located at a central position of the pixel electrode or near the central position, and the first end and the second end of the main slot respectively extend to two opposite sides of the pixel electrode, or extend beyond the two opposite sides of the pixel electrode.

13. The display device as claimed in claim 11, wherein the first data line and the second data line respectively comprise top line segments, bottom line segments, and vertical line segments located between the top line segments and the bottom line segments, the top line segment and the bottom line segment are respectively inclined toward the intermediate axis of the main slot, the vertical line segment of the first data line corresponds to a position of the first slot, and the vertical line segment of the second data line corresponds to a position of the second slot.

14. The display device as claimed in claim 10, wherein the pixel electrode of the pixel electrode layer is a rectangular electrode block, and the shielding electrode is disposed to surround the isolation groove and is electrically connected to the second metal layer.

15. The display device as claimed in claim 14, wherein an orthographic projection of an end of the first slot away from the main slot projected on the pixel electrode layer is beyond a top side of the pixel electrode, and an orthographic projection of an end of the second slot away from the main slot projected on the pixel electrode layer is beyond a bottom side of the pixel electrode.

16. The display device as claimed in claim 10, wherein the main slot is horizontal and is disposed in the common electrode in a horizontal direction, the first slot and the second slot are respectively vertical and perpendicular to the main slot, a width of the first data line is greater than or equal to a width of the first slot or a width of the second slot, and a width of the second data line is greater than or equal to the second slot or the width of the second slot.

17. The display device as claimed in claim 10, wherein the display panel further comprises a gate insulating layer, a passivation layer disposed on the second metal layer, and a color film layer and a planar layer disposed between the passivation layer and the second substrate.

18. The display device as claimed in claim 10, wherein the main slot has a first width, the first slot and the second slot respectively have second widths, the first width and the second width are less than or equal to 30 microns and greater than or equal to 3 microns.

19. The display device as claimed in claim 10, wherein the main slot, the first slot, and the second slot separately penetrate the common electrode.

20. The display device as claimed in claim 10, wherein the backlight module comprises a light-emitting element, a reflector plate, and a diffuser plate.

* * * * *